(12) United States Patent
Chang

(10) Patent No.: US 11,791,762 B2
(45) Date of Patent: Oct. 17, 2023

(54) SOLAR PANEL FOR PITCHED ROOF AND CONSTRUCTION METHOD THEREOF

(71) Applicant: Yaue-Sheng Chang, Taoyuan (TW)

(72) Inventor: Yaue-Sheng Chang, Taoyuan (TW)

( * ) Notice: Subject to any disclaimer, the term of this patent is extended or adjusted under 35 U.S.C. 154(b) by 148 days.

(21) Appl. No.: 17/102,366

(22) Filed: Nov. 23, 2020

(65) Prior Publication Data

US 2022/0166371 A1    May 26, 2022

(51) Int. Cl.
| | | |
|---|---|---|
| *H02S 20/25* | (2014.01) | |
| *H01L 31/048* | (2014.01) | |
| *H01L 31/054* | (2014.01) | |
| *H02S 30/00* | (2014.01) | |

(52) U.S. Cl.
CPC ............ *H02S 20/25* (2014.12); *H01L 31/048* (2013.01); *H01L 31/0543* (2014.12); *H02S 30/00* (2013.01)

(58) Field of Classification Search
CPC ............... H01L 31/054; H01L 31/0543; H01L 31/0547; H01L 31/0549; H01L 31/055; H01L 31/0236; H01L 31/0232; H01L 31/02167; H01L 31/02168; H01L 31/02327; H02S 20/23–26; H02S 20/25–26
See application file for complete search history.

(56) References Cited

U.S. PATENT DOCUMENTS

| | | | | |
|---|---|---|---|---|
| 2011/0214716 A1* | 9/2011 | Krajewski | ............. | H01L 31/049 |
| | | | | 136/251 |
| 2013/0118558 A1* | 5/2013 | Sherman | ................ | H01R 13/72 |
| | | | | 136/251 |
| 2020/0343397 A1* | 10/2020 | Hem-Jensen | ........... | F21S 8/086 |
| 2021/0036172 A1* | 2/2021 | Tark | .................... | H01L 31/0547 |
| 2021/0096279 A1* | 4/2021 | Hebrink | ............. | B29D 11/0074 |

FOREIGN PATENT DOCUMENTS

TW         739652 B1 *  9/2021

OTHER PUBLICATIONS

English Translation TW 739652, accessed Jul. 8, 2022 (Year: 2020).*

* cited by examiner

*Primary Examiner* — Daniel P Malley, Jr.
(74) *Attorney, Agent, or Firm* — Che-Yang Chen; Law Office of Michael Chen

(57) ABSTRACT

A solar panel for pitched roof and construction method of the solar panel are disclosed. The solar panel includes a substrate, a first bonding layer, an insulating layer, a second bonding layer, a solar cell module layer, a third bonding layer, a brightness enhancement film layer, a fourth bonding layer and a transparent fluorine element film layer from bottom to top. Since the peripheral fixing area of the substrate has fixing holes for fixing purposes, the solar panels of the present invention can replace the existing asphalt shingles and be applied on the pitched roof, and have the characteristics such as water removal, moisture resistance, extreme temperature resistance and windproof. The solar panel can not only provide renewable energy, but its neat appearance can also increase the beauty of the pitched roof.

18 Claims, 6 Drawing Sheets

US 11,791,762 B2

SOLAR PANEL FOR PITCHED ROOF AND CONSTRUCTION METHOD THEREOF

FIELD OF THE INVENTION

The present invention relates to a solar panel and a construction method of the solar panel. More particularly, the present invention relates to a solar panel for pitched roof and a construction method of the solar panel.

BACKGROUND OF THE INVENTION

The progress of human civilization is reflected in the reduction of resource consumption. From this point of view, the development and use of renewable energy or sustainable energy is also a milestone in civilization progress. Therefore, more and more countries have begun to focus on the promotion of renewable energy. The most notable achievement is the development and utilization of solar energy. In Taiwan, people can see many solar panels on the roofs of homes and factories, abandoned land, and even public facilities. These solar panels convert solar energy into electricity. In addition to supplying electrical equipment in nearby buildings, if there is surplus, the excess power can also be integrated into the power grid, selling to the units in need. The reason why Taiwan is able to install solar panels on a large scale is that most of the buildings in Taiwan are reinforced concrete structures, which are strong and resistant to strong winds. In addition, the top designs of these buildings are mostly flat, so it is very convenient to install solar panels. However, for some specific buildings, the installation of solar panels is very disadvantageous. An example is a pitched roof building with a wooden structure.

Generally speaking, pitched roof buildings using wooden structures are the main types of residential housing in European and American countries. Wood is easy to obtain, the construction price is cheap, and the house tax is also relative low. Pitched roof can be used for waterproofing and anti-snow. Construction is convenient. However, due to the lack of structural support and the angle of the erected surface, it is very unstable to connect the solar panel fixing device from the inside of the house to the solar panels outside of the house. Even if it can be erected, the raised solar panel structure is incompatible with the existing pitched roof design. Therefore, if it is desired to install solar panels to use renewable energy in a pitched roof building with a wooden structure, one must understand methods and materials of the traditional construction, and appropriately transform the solar panel structure.

The common waterproof and outermost building materials for pitched roofs are asphalt shingles. Asphalt shingles are lightweight, bendable and easy to cut. It can be fixed to the roof board of the pitched roof simply with a nail gun. As far as waterproofing is concerned, the stacking method of the upper and lower rows of asphalt shingles is similar to that of traditional tiles, forming an inclined ladder structure, so that rainwater can flow downwards along the slope. Furthermore, a layer of waterproof fabric (glue) is usually applied between the asphalt shingles and the roof board. Rainwater is hard to pass through the waterproof fabric and seeps down along the nails. If the reconstructed solar panels can have special connection devices and waterproof treatment, without changing the existing construction procedure to replace asphalt shingles, then it can not only have the advantages of the asphalt shingles being fastened to the pitched roof (no additional fixing), but also make the house equipped with the solar panels have a beautiful and consistent appearance. However, there is no such product in the market.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to solve the aforementioned problems, providing a new type of solar panel that can replace asphalt shingles, a solar panel for pitched roof is disclosed. It comprises: a substrate, comprising a peripheral fixing area and a functional component area; a first bonding layer, formed above the functional component area; an insulating layer, located above the first bonding layer and bonded to the substrate by the first bonding layer; a second bonding layer, formed above the insulating layer; a solar cell module layer, comprising at least one solar cell, located above the second bonding layer and bonded to the insulating layer by the second bonding layer, wherein power converted from solar energy is outputted from the at least one solar cell through at least two electrode wires, and the at least two electrode wires are extended to the peripheral fixing area; a third bonding layer, formed above the solar cell module layer and bonded to the second bonding layer partially; a brightness enhancement film layer, with an upper surface thereof, having a plurality of micro-prism structures, located above the third bonding layer and bonded to the solar cell module layer by the third bonding layer; a fourth bonding layer, formed above the brightness enhancement film layer; and a transparent fluorine element film layer, with an upper surface thereof, having a plurality of brightness enhancement structures having three-dimensional corrugated shape, located above the fourth bonding layer and bonded to the brightness enhancement film layer by the fourth bonding layer. The brightness enhancement structure guides external light beams from multi-directions thereinto, and the micro-prism structure changes light paths of the light beams from the transparent fluorine element film layer, causing the light beams enter the at least one solar cell more towards the vertical direction of the at least one solar cell.

Preferably, a plurality of first fixing holes and a plurality of second fixing holes may be formed on two parallel sides of the peripheral fixing area, respectively.

Preferably, a material of the substrate may be painted stainless steel, stainless steel, painted alloy steel plate, alloy steel plate, aluminum, aluminum alloy or plastic.

Preferably, a material of the first bonding layer may be Ethylene-Vinyl Acetate (EVA) or Polyolefin Elastomers (POE).

Preferably, a material of the second bonding layer may be EVA or POE.

Preferably, a material of the third bonding layer may be EVA or POE.

Preferably, a material of the fourth bonding layer may be EVA or POE.

Preferably, a material of the insulating layer may be Polyvinyl Fluoride (PVF) or Polyethylene Terephthalate (PET).

In one embodiment, if the quantity of the solar cells is 2 or more, electrode wires of anodes or cathodes are connected to form an electrode bus. According to the present invention, the three-dimensional corrugated shape of the brightness enhancement structure may be a circle that is consecutively adjacent to one another in a plane viewed from the top. Each circle has a radius of curvature no more than 1 mm.

The substrate has a square or rectangular appearance.

A construction method of the solar panel for pitched roof is also disclosed in the present invention. It comprises the steps of: a) placing a waterproof layer above a roof board of a pitched roof; b) placing a plurality of solar panels with a side of the first fixing holes thereof arranged along a benchmark side of the roof board in a row; c) fixing the solar panels on the roof board by nails or screws each passing through one first fixing hole and the waterproof layer; d) placing a plurality of solar panels in a new row after the previous row of solar panels with the first fixing holes of the newly placed solar panels sequentially aligned with the second fixing holes of the solar panels in the previous row; e) fixing the solar panels on the roof board by nails or screws each passing through one first fixing hole, a corresponding second fixing hole and the waterproof layer; f) repeating the step d) and the step e) until a predetermined area of the roof board is covered by the solar panels; and g) connecting the electrode wires or the electrode buses of adjacent two solar panels by a waterproof conductive tape with anode electrically connected to cathode.

According to the present invention, the benchmark side may be parallel to or perpendicular to a specific horizontal level. The waterproof layer may be a waterproof linoleum.

Since the peripheral fixing area of the substrate has fixing holes for fixing purposes, the solar panels of the present invention can replace the existing asphalt shingles and be applied on the pitched roof, and have the characteristics such as water removal, moisture resistance, extreme temperature resistance and windproof. The solar panel can not only provide renewable energy, but its neat appearance can also increase the beauty of the pitched roof.

DETAILED DESCRIPTION OF THE PREFERRED EMBODIMENTS

The present invention will now be described more specifically with reference to the following embodiments.

Figure 1:
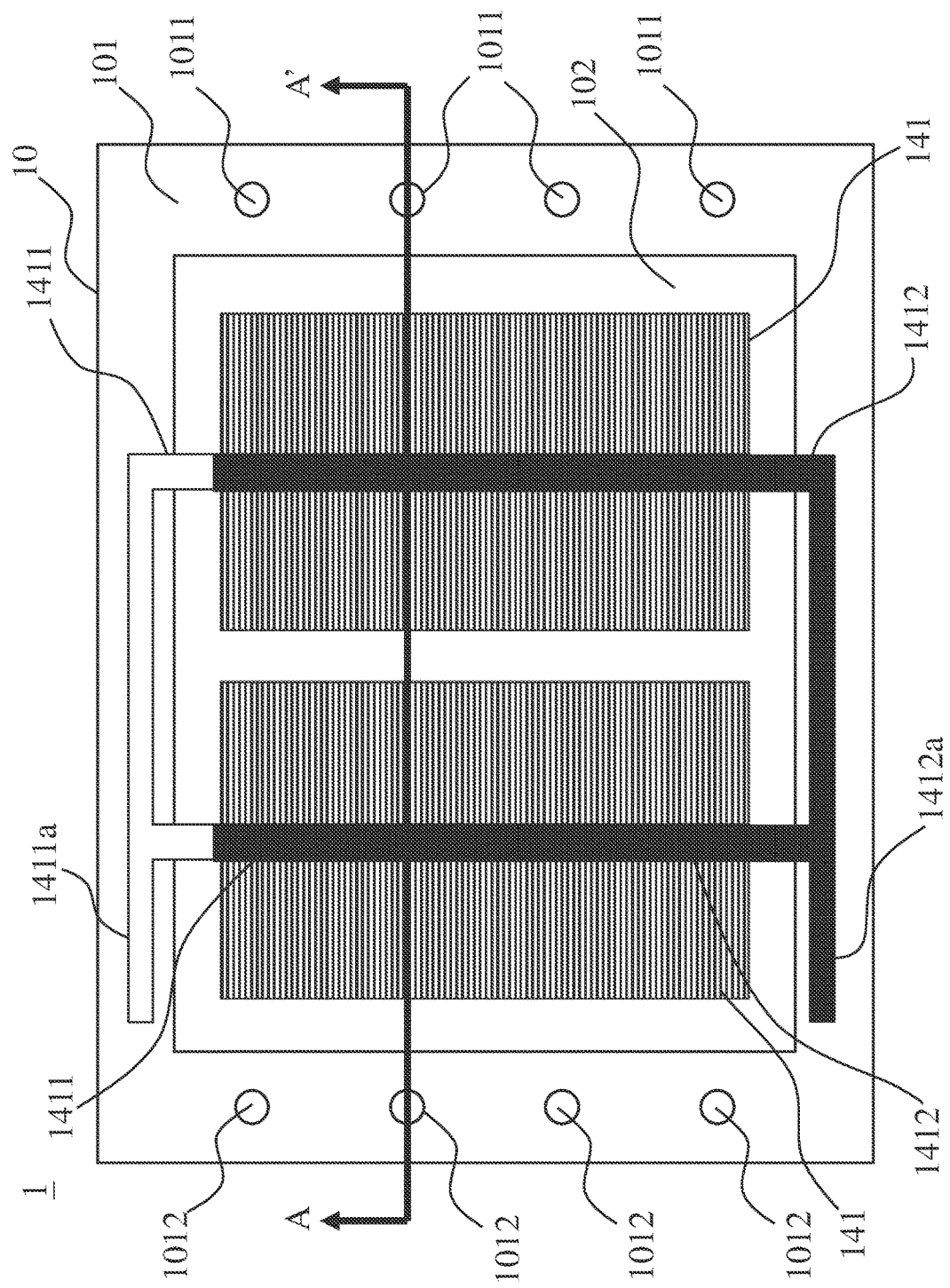
FIG. 1 is a schematic top view of a solar panel for pitched roof according to an embodiment of the present invention.
Figure 2:
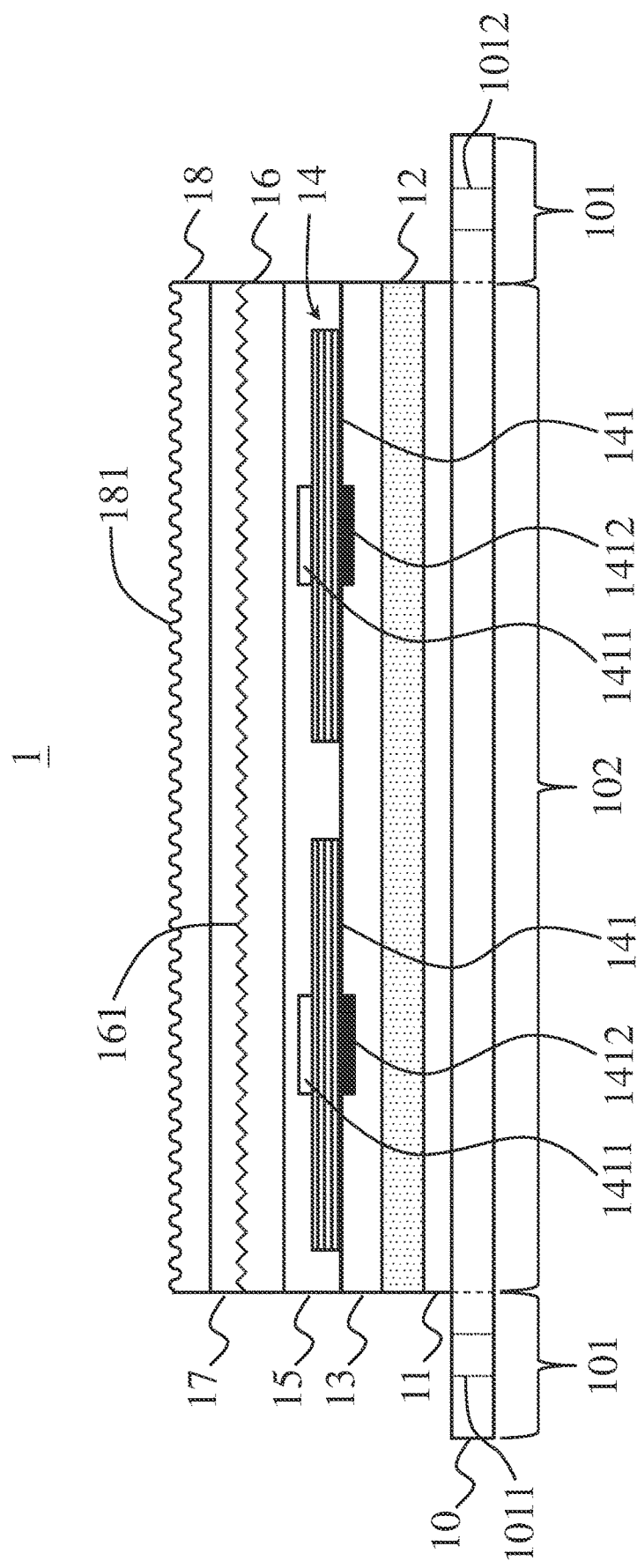
FIG. 2 is a sectional view of the solar panel along a line AA.

Please see FIG. 1 and FIG. 2. FIG. 1 is a schematic top view of a solar panel for a pitched roof according to an embodiment of the present invention. FIG. 2 is a sectional view of the solar panel along a line AA'. It should be noticed that, for convenience, FIG. 1 and FIG. 2 are not drawn in proportion to the actual product design. For example, the actual thickness of the solar panel 1 may be 2 mm, and its length and width are often tens of centimeters or even more than one meter. Such a design will cause excessive squeezing of the thickness in the drawing and make it impossible to distinguish the details. Therefore, the thickness ratio of FIG. 2 is much larger than its length ratio and width ratio. The location between the components and the thickness, length and width of the components are also illustrative, and the present invention is not limited by the content of the drawing. In addition, since many of the technical components of the solar panel 1 are transparent, FIG. 1 only shows the technical components that can be seen in the implementation.

Structurally, the solar panel 1 comprises a substrate 10, a first bonding layer 11, an insulating layer 12, a second bonding layer 13, a solar cell module layer 14, a third bonding layer 15, a brightness enhancement film layer 16, a fourth bonding layer 17 and a transparent fluorine element film layer 18 from bottom to top. Characteristics, functions, materials and combinations of the above technical components will be detailed in the text below.

The substrate 10 is the basis for carrying other components. It needs to have enough robustness. Preferably, it can resist heat, cold and moisture, Therefore, a material of the substrate 10 may be painted stainless steel, stainless steel, painted alloy steel plate, alloy steel plate, aluminum, aluminum alloy or plastic. Take stainless steel as an example in this embodiment. In principle, the appearance of the substrate 10 is not limited, as long as there are two parallel sides that can be used for installation. Therefore, the substrate 10 preferably has a square or rectangular appearance. In the present embodiment, it is rectangular. The substrate 10 comprises a peripheral fixing area 101 and a functional component area 102. The functional component area 102 is the area used to stack other technical components. The peripheral fixing area 101 is the part that does not belong to the functional component area 102 but can be used to connect to the substrate 10 of the adjacent solar panel 1. In the present embodiment, the functional component area 102 is a rectangular area that is smaller than the overall substrate 10. A number of first fixing holes 1011 and a number of second fixing holes 1012 (FIG. 2 shows the locations of the fixing holes with a dotted line) are formed on two parallel sides of the peripheral fixing area 101, respectively. In the present embodiment, the quantities of the first fixing holes 1011 and the second fixing holes 1012 are both 4. In practice, the number can be designed according to actual needs. The first fixing hole 1011 and the second fixing hole 1012 are used to pass through nails or screws to fix the solar panel 1 on the roof board. In other embodiments, the aforementioned two parallel sides may not have fixing holes. By directly nailing the nails through the peripheral fixing area 101, the solar panel 1 is fixed on the roof board.

The first bonding layer 11 is formed above the functional component area 102. A material of the first bonding layer 11 is Ethylene-Vinyl Acetate (EVA). In practice, the first bonding layer 11 is used to bond to the substrate 10 and the insulating layer 12 by using a piece of EVA film of suitable size, being melted, bonded crosslinked and cured after hot pressing under certain conditions. EVA is non-adhesive and anti-adhesive at room temperature. After curing, the EVA film becomes completely transparent and has a fairly high light transmittance. The cured EVA film is elastic, has the advantages of heat resistance, moisture resistance, low temperature resistance and impact resistance, and has good adhesion to metal, glass and plastic. It can maintain the overall stability of the solar panel 1 (not easy to crack). Considering environmental factors, a material of the first bonding layer 11 may also be Polyolefin Elastomers (POE). It also has characteristics similar to EVA.

The insulating layer 12 is located above the first bonding layer 11, bonded to the substrate 10 by the first bonding layer 11. The purpose of the insulating layer 12 is to electrically insulate the solar cell module layer 14 bonded above from the substrate 10, preventing the electric energy generated in the solar cell module layer 14 from leaking to the substrate 10 and the background environment. In the present embodiment, a material of the insulating layer 12 is Polyvinyl Fluoride (PVF). Specifically, it is a PVF film of the right size, placed on the first bonding layer 11. PVF film has high resistance and durability to sunlight, chemical solvents, acid and alkali corrosion, moisture and oxidation, and is a suitable electrically insulating material. In addition, the insulating layer 12 can also use Polyethylene Terephthalate (PET) as the material. In practice, it can be a PET film of proper size.

The second bonding layer 13 is formed above the insulating layer 12. The purpose is to bond the solar cell module layer 14 to the structure below the second bonding layer 13. The materials and methods of application for the second bonding layer 13 are the same as those of the first bonding layer 11. It is not repeated here.

Figure 3:
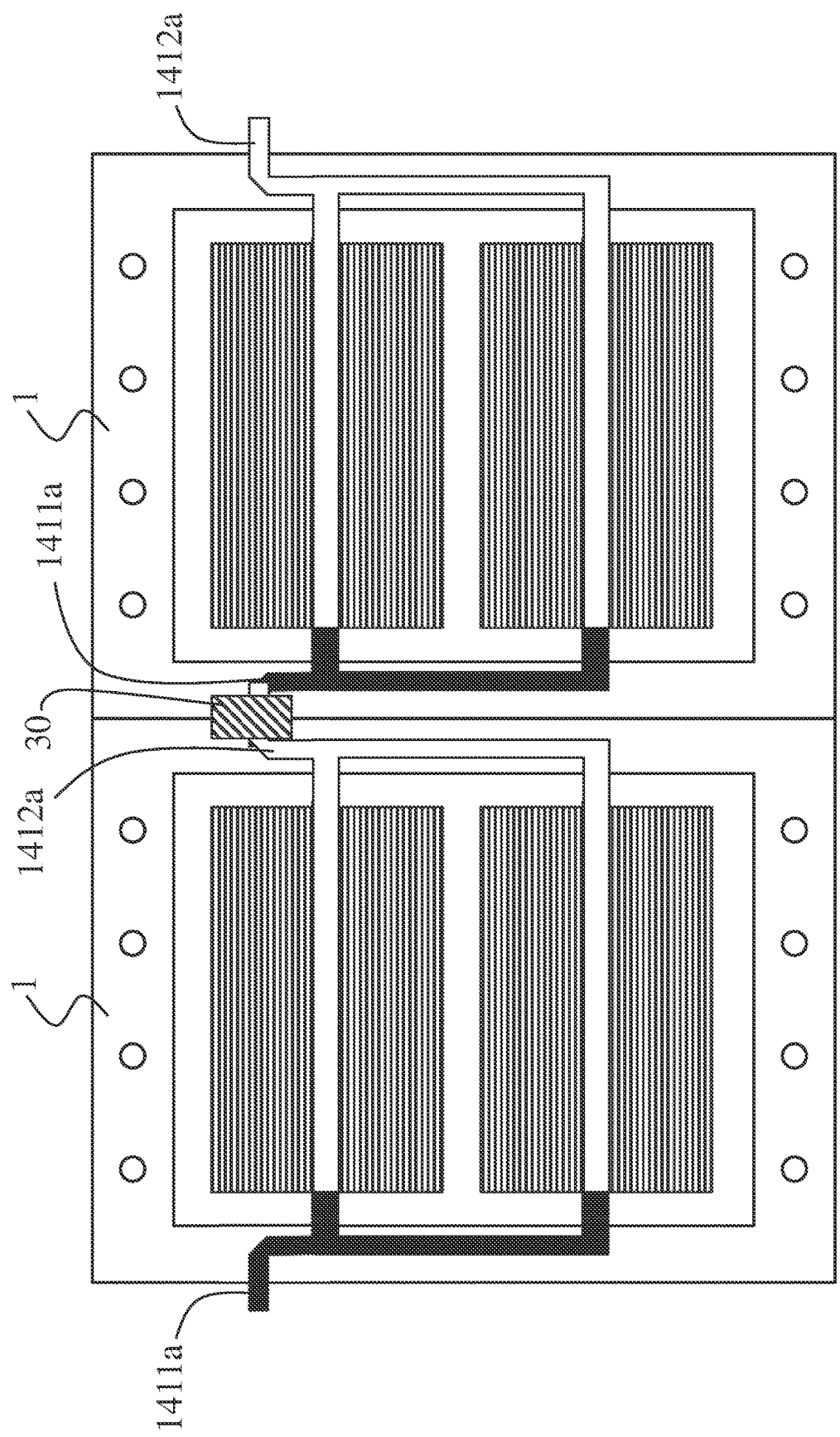
FIG. 3 shows an electrical connection between two solar panels.

The solar cell module layer 14 comprises at least one solar cell 141. Power converted from solar energy is outputted from the at least one solar cell 141 through at least two electrode wires. In the present embodiment, there are 2 solar cells 141 are used in the solar cell module layer 14, composed in parallel with each other. According to the spirit of the present invention, the 2 solar cells 141 can also be composed in series. In addition, the number of the solar cells 141 can be more. One connects to one another in series, parallel or parallel series design for electrical connection. Of course, the solar cell module layer 14 may also contain one solar cell 141. There is no connection requirement between solar cells 141. Like a general solar cell, the solar cell 141 in the present invention has an upper electrode wire 1411 (frame of white background is used for illustration in FIG. 1 and FIG. 2) on the upper side. It belongs to the cathode. The solar cell 141 also has a lower electrode wire 1412 (frame of black background is used for illustration in FIG. 1 and FIG. 2) on the lower side. It belongs to the anode. There are 4 electrode wires in total. However, the simplest case is one solar cell 141 with one upper electrode wire 1411 and one lower electrode wire 1412. The solar cell module layer 14 is located above the second bonding layer 13 and bonded to the insulating layer 12 by the second bonding layer 13, further bonded to the structure below the insulating layer 12. 4 electrode wires are not restricted to be in the functional component area 102, but are extended to the peripheral fixing area 101. As shown in FIG. 1, according to the present invention, if the quantity of the solar cells 141 is 2 or more, electrode wires of anodes or cathodes can be connected to form an electrode bus. As shown in FIG. 1, 2 upper electrode wires 1411 are connected to form an upper electrode bus 1411a. 2 lower electrode wires 1412 are connected to form a lower electrode bus 1412a. The function of the electrode bus is to connect the electrode wires of anodes or cathodes to facilitate electrical connection with other solar panels 1 through a single interface. When the solar panel 1 is not under construction for fixing, extension ends of the upper electrode bus 1411a and the lower electrode bus 1412a can be movably attached to the peripheral fixing area 101. When the solar panel 1 is fixed to the roof board and needs to electrically connect to other solar panels 1, extension ends of the upper electrode bus 1411a and the lower electrode bus 1412a can be folded to the outside of the peripheral fixing area 101. For the folding and electrical connection method, please see FIG. 3. FIG. 3 shows an electrical connection between two solar panels 1. Folding method of the extension ends of the upper electrode buses 1411a and the lower electrode buses 1412a of two solar panels 1 are shown in FIG. 3. The extension end of the lower electrode bus 1412a of the left solar panel 1 overlaps the extension end of the upper electrode bus 1411a of the right solar panel 1. It forms an electrical connection. In order to maintain the electrical connection between the extension ends of the two electrode buses and prevent the intrusion of external moisture, a waterproof conductive tape 30 can be used to stick to the overlap. In addition, if the distance between the extension ends is too long, for example, the solar panel 1 needs to be electrically connected across the roof, the waterproof conductive tape 30 is used to directly connect the extension ends of the upper electrode bus 1411a and the lower electrode bus 1412a, or the waterproof conductive tape 30 is attached to a conductive strip and the extension ends of the upper electrode bus 1411a and the lower electrode bus 1412a after the conductive strip is applied to connect the extension ends of the two electrode bus.

The third bonding layer 15 is formed above the solar cell module layer 14 and bonded to the second bonding layer 13 partially. The purpose is to bond the brightness enhancement film layer 16 to the structure below the third bonding layer 15. The materials and methods of application for the third bonding layer 15 are the same as those of the first bonding layer 11. It is not repeated here.

The brightness enhancement film layer 16 uses PET as a better material. It forms a soft and elastic film layer. The brightness enhancement film layer 16 is located above the third bonding layer 15 and bonded to the solar cell module layer 14 by the third bonding layer 15. An upper surface of the brightness enhancement film layer 16 has a plurality of micro-prism structures 161. The micro-prism structures 161 look like small spikes from the sectional direction. Along a direction vertical to the sectional direction, every spike forms a prism and close contacts to one another. The specific role will be illustrated later.

The fourth bonding layer 17 is formed above the brightness enhancement film layer 16. The purpose is to bond the transparent fluorine element film layer 18 to the structure below the fourth bonding layer 17. The materials and methods of application for the fourth bonding layer 17 are the same as those of the first bonding layer 11. It is not repeated here.

The transparent fluorine element film layer 18 is a technical component of the solar panel 1 that receives external light. In practice, high light transmission Teflon can be used as the material. An upper surface of the transparent fluorine element film layer 18 has a plurality of brightness enhancement structures 181 each having three-dimensional corrugated shape. The transparent fluorine element film layer 18 is located above the fourth bonding layer 17 and bonded to the brightness enhancement film layer 16 by the fourth bonding layer 17. Continuous "peak-trough" cross-sectional edge shapes in any cross section (except the horizontal direction) of the brightness enhancement structure 181 can be obtained. The three-dimensional corrugated shape of the brightness enhancement structure 181 is a circle that is consecutively adjacent to one another in a plane viewed from the top, and each circle has a radius of curvature no more than 1 mm.

Figure 4:
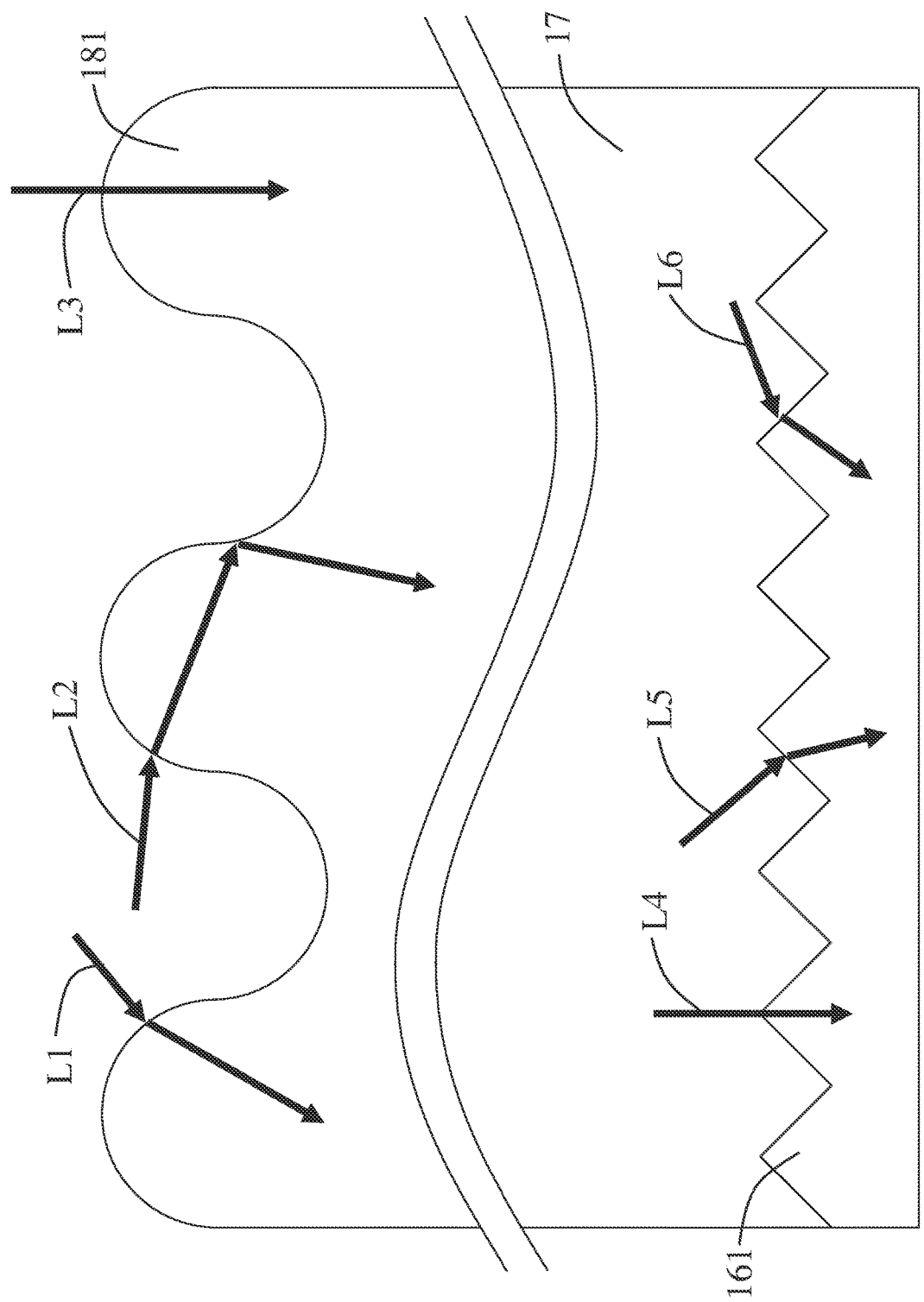
FIG. 4 illustrates the practices and effects of micro-prism structure and brightness enhancement structure in changing light path.

Please see FIG. 4. It illustrates the practices and effects of the micro-prism structure 161 and the brightness enhancement structure 181 in changing light path. In FIG. 4, the light path of the incident light beams is represented by a single arrow or continuously connected arrows. Due to the three-dimensional corrugated shape of the brightness enhancement structure 181, external light beams from multi-directions can be guided into the brightness enhancement structure 181. For example, on a light path L1, the light beams are refracted and directed to the transparent fluorine element film layer 18; on a light path L2, light beams enter the transparent fluorine element film layer 18 after one refraction and one total reflection; on a light path L3, since the incident angle of the light beams is perpendicular to the incident surface, the light beams do not change the direction and directly enter the transparent fluorine element film layer 18. Based on the above three light paths, more light beams outside of the transparent fluorine element film layer 18 can enter the transparent fluorine element film layer 18. Furthermore, the micro-prism structure 161 can change light paths of the light beams from the transparent fluorine element film layer 18, causing the light beams enter one of the 2 solar cell 141 more towards the vertical direction of the solar cell 141. Please see FIG. 4 again. If the light beams in the fourth bonding layer 17 follow a light path L4, they can enter the solar cell 141 without changing its direction; if the original direction of the light beams deviate from the vertical direction of the solar cell 141, the light beams may follow a light path L5 with the direction of travel being corrected to be closer to the vertical direction of the solar cell 141 and go toward the solar cell 141; if the original direction of the light beams deviate more from the vertical direction of the solar cell 141, the light beams may follow a light path L6 with the direction of travel being corrected to be closer to the vertical direction of the solar cell 141 and go toward the solar cell 141. However, compared with the light path L5, the light path L6 has a larger incident angle to solar cell 141. The larger the incident angle is, the less energy the solar cell 141 can convert. But if there is no micro-prism structure 161, the incident angle of many light beams will be large, which reduces the photoelectric conversion efficiency of solar cell 141.

Figure 5:
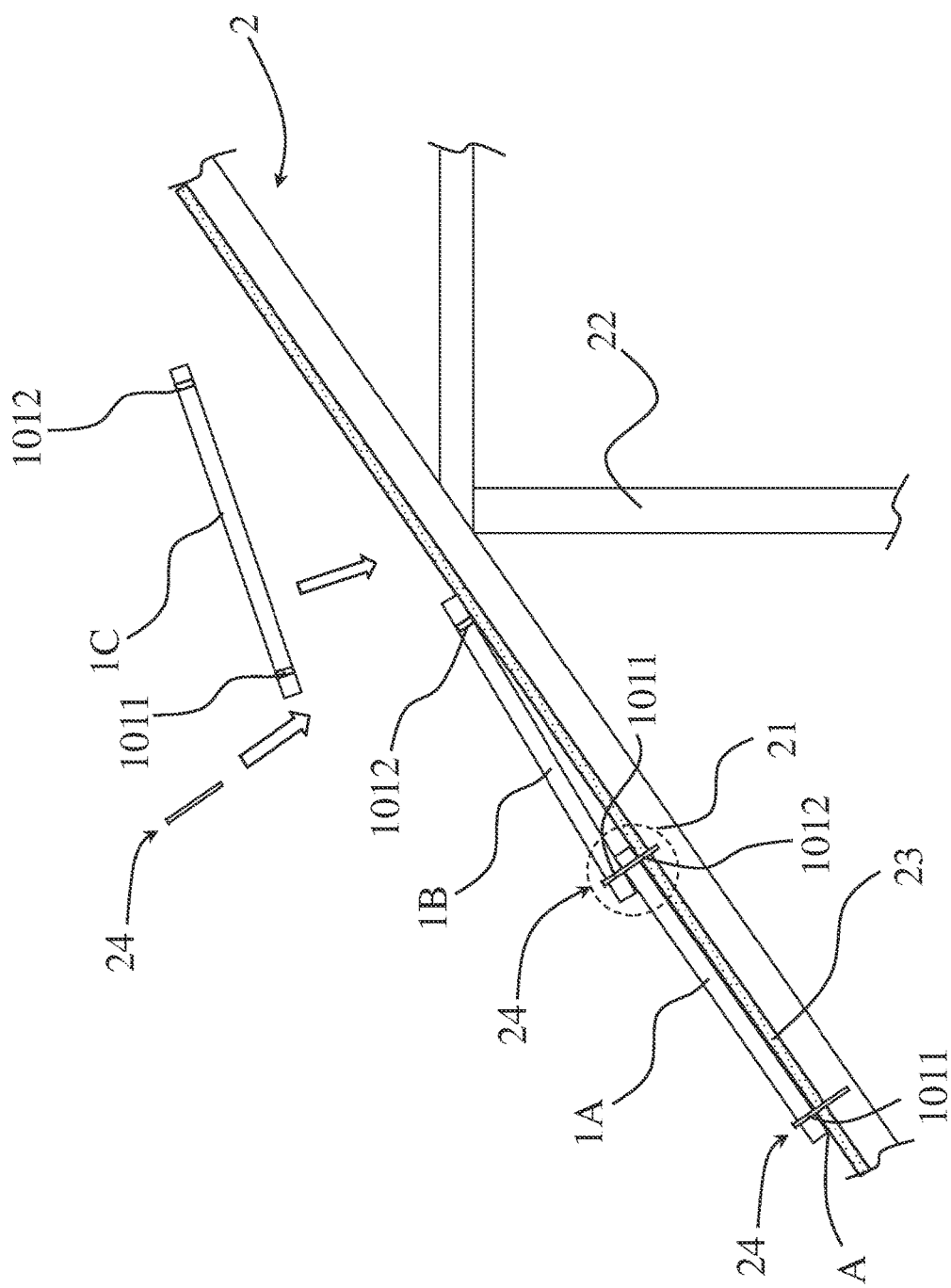
FIG. 5 shows a placing operation of the solar panels.
Figure 6:
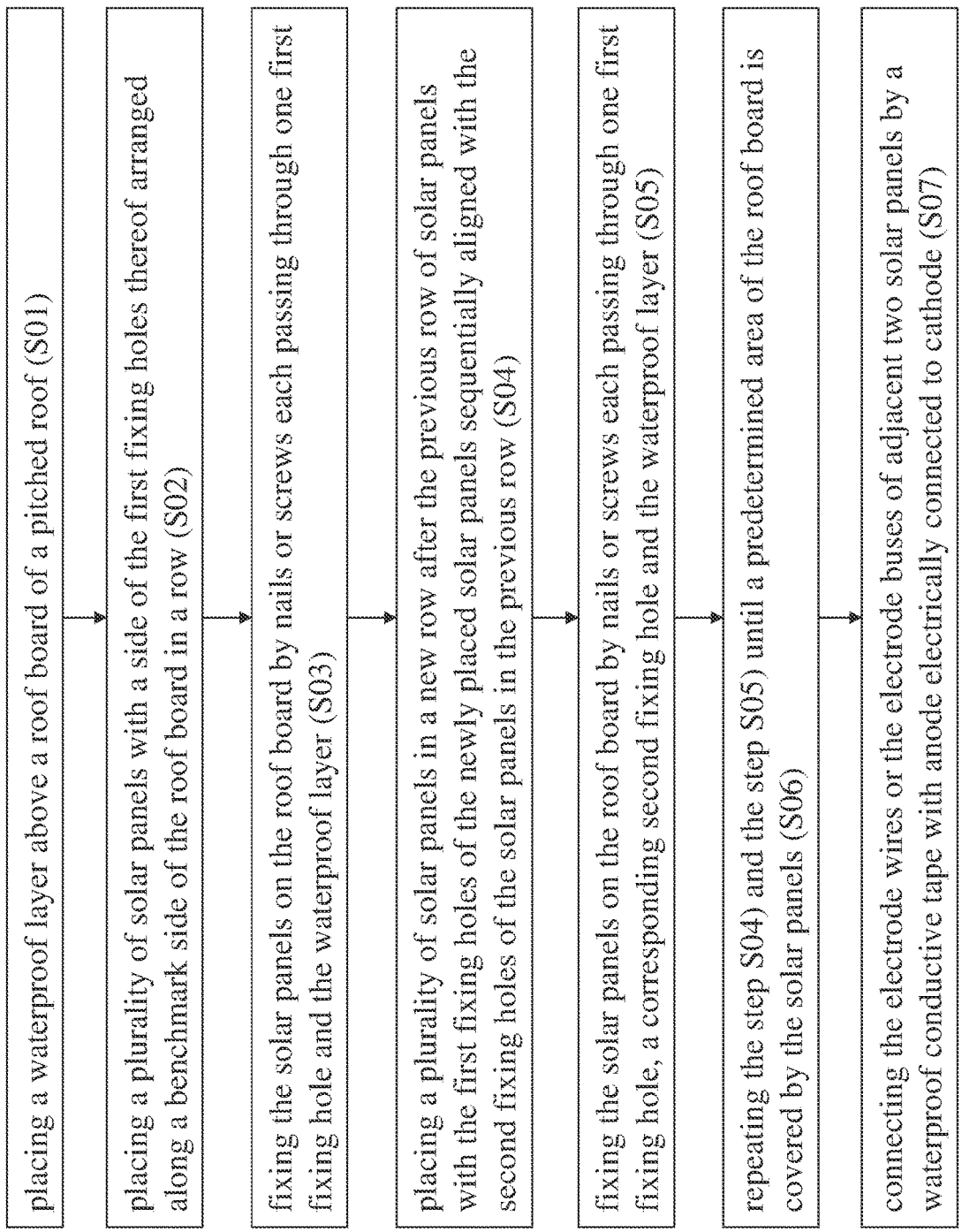
FIG. 6 is a flow chart of a construction method of the solar panels.

A construction method of the solar panel for pitched roof 1 is also disclosed in the present invention. In order to have a better understanding of the construction method, please refer to FIG. 5 and FIG. 6 at the same time. FIG. 5 shows a placing operation of the solar panels 1. FIG. 6 is a flow chart of a construction method of the solar panels 1. In FIG. 5, a portion of a pitched roof 2 includes a roof board 21 and a supporting system 22 which supports the roof board 21. First, a first step of the construction method is placing a waterproof layer 23 above the roof board 21 of the pitched roof 2 (S01). A waterproof linoleum can be used as the waterproof layer 23. Next, a second step is placing a number of solar panels with a side of the first fixing holes 1011 of the solar panels arranged along a benchmark side of the roof board 21 in a row (S02). Here, since FIG. 5 is a sectional schematic of the pitched roof 2, only one solar panel can be drawn in each row. For convenience, the solar panel of the first row is represented by a first row solar panel 1A. A definition of the benchmark side is parallel to a specific horizontal level. For example, the benchmark side is 3 meters above the ground, which is at location A in FIG. 5. In this case, the bottom edge of the first row solar panel 1A will be lined up along a virtual straight line perpendicular to location A. The solar panels are installed from the bottom of roof board 21 (vertical construction). A definition of the benchmark side may also be perpendicular to the specific horizontal level on the roof board 21, for example, a line perpendicular to the level of 3 meters above the ground. Namely, it is a straight line parallel to the waterproof layer 23 on FIG. 5. Now, the solar panels are horizontally installed from one side of roof board 21 to the other (horizontal construction).

Next, a third step is fixing the first row solar panels 1A on the roof board 21 by nails or screws each passing through one first fixing hole 1011 and the waterproof layer 23 (S03). In the present embodiment, nails 24 are used to pass the first fixing hole 1011 and the waterproof layer 23 to fix the first row solar panels 1A on the roof board 21. A fourth step is placing a number of solar panels in a new row after the previous row of solar panels (the first row solar panels 1A) with the first fixing holes 1011 of the newly placed solar panels sequentially aligned with the second fixing holes 1012 of the solar panels in the previous row (S04). For convenience, the newly placed solar panels are called second row solar panels 1B. Next, a fifth step is fixing the solar panels (second row solar panels 1B) on the roof board 21 by nails 24 (or screws) each passing through one first fixing hole 1011, a corresponding second fixing hole 1012 and the waterproof layer 23 (S05).

A sixth step is repeating the step S04 and step S05 until a predetermined area of the roof board 21 is covered by the solar panels (S06). It can be seen from FIG. 5 that a third row solar panels 1C following the second row solar panels 1B are placed. The fixing method is also nailing to the roof board 21 by nails 24 each through the first fixing hole 1011, the corresponding second fixing hole 1012 and the waterproof layer 23. How many rows of solar panels need to be used and how many solar panels are needed in each row depend on the size and shape of the predetermined area. In addition, no matter it is vertical construction or horizontal construction, all solar panels are installed obliquely on the roof board 21. Rainwater can flow along the upper solar panel to the lower solar panel, instead of leaking from the nail 24 to the roof board 21 through the waterproof layer 23. Last, a seventh step is connecting the electrode wires or the electrode buses of adjacent two solar panels by a waterproof conductive tape with anode electrically connected to cathode (S07). The step S07 shows one of the advantages of the present invention: the electrical connection between solar panels can be simply implemented with waterproof conductive tape, which is waterproof and easy to use.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A solar panel for a pitched roof, comprising: a substrate, comprising a peripheral fixing area and a functional component area; a first bonding layer, formed above the functional component area; an insulating layer, located above the first bonding layer and bonded to the substrate by the first bonding layer; a second bonding layer, formed above the insulating layer; a solar cell module layer, comprising at least one solar cell, located above the second bonding layer and bonded to the insulating layer by the second bonding layer, wherein power converted from solar energy is outputted from the at least one solar cell through at least two electrode wires, and the at least two electrode wires are extended to the peripheral fixing area; a third bonding layer, formed above the solar cell module layer and bonded to the second bonding layer partially; a brightness enhancement film layer, with an upper surface thereof, having a plurality of micro-prism structures, located above the third bonding layer and bonded to the solar cell module layer by the third bonding layer; a fourth bonding layer, formed above the brightness enhancement film layer; and a transparent fluorine element film layer, with an upper surface thereof, having a plurality of brightness enhancement structures which has a three-dimensional corrugated shape, located above the fourth bonding layer and bonded to the brightness enhancement film layer by the fourth bonding layer, wherein each of the brightness enhancement structures guides external light beams from multi-directions thereinto, the micro-prism structure changes light paths of the light beams from the transparent fluorine element film layer, causing the light beams to enter the at least one solar cell more towards a normal direction of a surface of each solar cell, a material of the substrate is painted stainless steel, stainless steel, painted alloy steel plate, alloy steel plate, aluminum or aluminum alloy and a plurality of first fixing holes and a plurality of second fixing holes are formed on two parallel sides of the peripheral fixing area, respectively.

2. The solar panel fora pitched roof according to claim 1, wherein a material of the first bonding layer is Polyolefin Elastomers (POE).

3. The solar panel for a pitched roof according to claim 1, wherein a material of the second bonding layer is POE.

4. The solar panel for a pitched roof according to claim 1, wherein a material of the third bonding layer is POE.

5. The solar panel for a pitched roof according to claim 1, wherein a material of the fourth bonding layer is POE.

6. The solar panel for a pitched roof according to claim 1, wherein a material of the insulating layer is Polyvinyl Fluoride (PVF) or Polyethylene Terephthalate (PET).

7. The solar panel fora pitched roof according to claim 1, wherein if the quantity of the solar cells is 2 or more, electrode wires of anodes of the solar cells or electrode wires of cathodes of the solar cells are connected to form an electrode bus.

8. The solar panel for a pitched roof according to claim 1, wherein the three-dimensional corrugated shape of the brightness enhancement structure forms circles that are consecutively adjacent to one another in a plane viewed from above of the brightness enhancement structure, and each circle has a radius of curvature no more than 1 mm.

9. The solar panel for a pitched roof according to claim 1, wherein the substrate has a square or rectangular appearance.

10. A construction method of the solar panel for pitched roof according to claim 1, comprising steps of: a) placing a waterproof layer above a roof board of a pitched roof; b) placing a plurality of solar panels with a side of the first fixing holes thereof arranged along a benchmark side of the roof board in a row; c) fixing the solar panels on the roof board by nails or screws each passing through one first fixing hole and the waterproof layer; d) placing a plurality of solar panels in a new row after the previous row of solar panels with the first fixing holes of the newly placed solar panels sequentially aligned with the second fixing holes of the solar panels in the previous row; e) fixing the solar panels on the roof board by nails or screws each passing through one first fixing hole, a corresponding second fixing hole and the waterproof layer; f) repeating the step d) and the step e) until a predetermined area of the roof board is covered by the solar panels; and g) connecting the electrode wires or the electrode buses of adjacent two solar panels by a waterproof conductive tape with anode electrically connected to cathode.

11. The construction method according to 10, wherein the benchmark side is parallel to or perpendicular to a specific horizontal level.

12. The construction method according to 10, wherein the waterproof layer is a waterproof linoleum.

13. A construction method of the solar panel for pitched roof according to claim 7, comprising steps of: a) placing a waterproof layer above a roof board of a pitched roof; b) placing a plurality of solar panels with a side of the first fixing holes thereof arranged along a benchmark side of the roof board in a row; c) fixing the solar panels on the roof board by nails or screws each passing through one first fixing hole and the waterproof layer; d) placing a plurality of solar panels in a new row after the previous row of solar panels with the first fixing holes of the newly placed solar panels sequentially aligned with the second fixing holes of the solar panels in the previous row; e) fixing the solar panels on the roof board by nails or screws each passing through one first fixing hole, a corresponding second fixing hole and the waterproof layer; f) repeating the step d) and the step e) until a predetermined area of the roof board is covered by the solar panels; and g) connecting the electrode wires or the electrode buses of adjacent two solar panels by a waterproof conductive tape with anode electrically connected to cathode.

14. The construction method according to 13, wherein the benchmark side is parallel to or perpendicular to a specific horizontal level.

15. The construction method according to 13, wherein the waterproof layer is a waterproof linoleum.

16. A construction method of the solar panel for pitched roof according to claim 8, comprising steps of: a) placing a waterproof layer above a roof board of a pitched roof; b) placing a plurality of solar panels with a side of the first fixing holes thereof arranged along a benchmark side of the roof board in a row; c) fixing the solar panels on the roof board by nails or screws each passing through one first fixing hole and the waterproof layer; d) placing a plurality of solar panels in a new row after the previous row of solar panels with the first fixing holes of the newly placed solar panels sequentially aligned with the second fixing holes of the solar panels in the previous row; e) fixing the solar panels on the roof board by nails or screws each passing through one first fixing hole, a corresponding second fixing hole and the waterproof layer; f) repeating the step d) and the step e) until a predetermined area of the roof board is covered by the solar panels; and g) connecting the electrode wires or the electrode buses of adjacent two solar panels by a waterproof conductive tape with anode electrically connected to cathode.

17. The construction method according to 16, wherein the benchmark side is parallel to or perpendicular to a specific horizontal level.

18. The construction method according to 16, wherein the waterproof layer is a waterproof linoleum.

\* \* \* \* \*